United States Patent [19]

Neilson et al.

[11] Patent Number: 5,323,036
[45] Date of Patent: Jun. 21, 1994

[54] POWER FET WITH GATE SEGMENTS COVERING DRAIN REGIONS DISPOSED IN A HEXAGONAL PATTERN

[75] Inventors: John M. S. Neilson, Norristown; Frederick P. Jones, Mountaintop; Joseph A. Yedinak, Wilkes-Barre; Christopher L. Rexer, Mountaintop, all of Pa.

[73] Assignee: Harris Corporation, Melbourn, Fla.

[21] Appl. No.: 822,732

[22] Filed: Jan. 21, 1992

[51] Int. Cl.$^5$ .................. H01L 29/10; H01L 29/78; H01L 27/10
[52] U.S. Cl. ............................ 257/287; 257/331; 257/341; 257/401
[58] Field of Search ............... 257/287, 331, 341, 401

[56] References Cited

U.S. PATENT DOCUMENTS

| | | | |
|---|---|---|---|
| 4,015,278 | 3/1978 | Fukuta | 257/266 |
| 4,055,884 | 11/1977 | Jambotkar | 257/341 |
| 4,072,975 | 2/1978 | Ishitani | 257/328 |
| 4,376,286 | 3/1983 | Lidow et al. | 257/342 |
| 4,412,242 | 10/1983 | Herman et al. | 257/341 |
| 4,593,302 | 6/1986 | Lidow et al. | 257/342 |
| 4,823,176 | 4/1989 | Baliga et al. | 257/335 |
| 4,974,059 | 11/1990 | Kinzer | 257/342 |
| 4,982,249 | 1/1991 | Kim et al. | 257/401 |
| 5,008,725 | 4/1991 | Lidow et al. | 257/341 |
| 5,008,725 | 4/1991 | Lidow et al. | 257/341 |
| 5,192,989 | 3/1993 | Matsushita et al. | 257/401 |

FOREIGN PATENT DOCUMENTS

| | | |
|---|---|---|
| 51-85381 | 7/1976 | Japan . |
| 52-106688 | 9/1977 | Japan . |
| 2292868 | 12/1990 | Japan 257/401 |

OTHER PUBLICATIONS

"High Efficiency Power Switching with Cascaded Hxfets and Bipolars," Electronic Engineering, Nov. 1981, p. 61.

Primary Examiner—Rolf Hille
Assistant Examiner—Mahshid Saadat
Attorney, Agent, or Firm—Spensley Horn Jubas & Lubitz

[57] ABSTRACT

In a power FET composed of a substrate having upper and lower surfaces, the FET providing a current flow path between the upper and lower surfaces, and the FET having a plurality of drain regions extending to the substrate upper surface and an insulated gate electrode disposed on the upper surface, the improvement wherein said drain regions are disposed in a hexagonal lattice pattern, and said gate electrode comprises: a plurality of gate segments each covering a respective drain region; and a plurality of connecting segments each connecting together three of said gate segments.

12 Claims, 2 Drawing Sheets

POWER FET WITH GATE SEGMENTS COVERING DRAIN REGIONS DISPOSED IN A HEXAGONAL PATTERN

BACKGROUND OF THE INVENTION

The present invention relates to power transistors of the vertical type, principal examples of which are metal oxide silicon field effect transistors (hereinafter MOSFETs) and insulated gate bipolar transistors (hereinafter IGBTs), which are generally considered to be another type of FET.

Known devices of this type include those having geometries such that multiple base regions are formed within a large drain area, or a large base region is formed to create multiple drain regions. Structures of the first type are exemplified by those disclosed in U.S. Pat. No. 5,008,725, while structures of the second type are exemplified by those disclosed in U.S. Pat. No. 4,823,176.

The type of geometry described in U.S. Pat. No. 4,823,176 offers certain benefits, including the possibility of achieving a relatively high breakdown voltage.

One factor influencing the performance of such FETs, and in particular current handling capability, is channel width. U.S. Pat. No. 4,823,176 describes embodiments in which the multiple drain regions are arranged in a hexagonal lattice pattern, which results in a relatively great channel width. The associated gate electrode has gate segments covering the drain regions and connecting segments connecting together adjacent gate segments.

However, the gate electrode pattern which has previously been proposed, as disclosed in U.S. Pat. No. 4,823,176, is such that it gives the semiconductor device less than an optimum on-resistance. This results from the necessary shape of the connecting segments and the principles employed to construct the gate segment pattern. This will be explained in greater detail below with reference to FIG. 1.

FIG. 1 is a plan view showing a hexagonal FET gate pattern constructed according to the principles disclosed in U.S. Pat. No. 4,823,176. Although that patent does not illustrate a hexagonal gate pattern, the pattern shown in FIG. 1 would be created if a hexagonal pattern were formed in a manner to be a counterpart to the square pattern which is illustrated in the patent.

Such a pattern is composed essentially of gate segments 14, with each adjacent pair of gate segments being connected together by a respective connecting segment 16 to form a hexagonal matrix enclosing individual source contact areas 18. For reasons relating primarily to the manner in which the source electrode (not shown) should be operatively associated with the other transistor regions, gate segments 14 cannot be significantly increased in diameter and connecting segments 16 cannot be substantially increased in width. Thus, with the type of gate pattern shown in FIG. 1, a separate connecting segment is required between each adjacent pair of gate segments, and the regions occupied by the connecting segments can not contain an effective channel portion.

SUMMARY OF THE INVENTION

It is an object of the present invention to improve the operating behavior of devices having such gate electrodes.

A more specific object of the invention is to reduce the on-resistance of a device having a gate electrode in the form of a lattice structure.

Another object of the invention is to increase the current carrying capability of such devices.

The above and other objects are achieved, according to the present invention, in a power FET composed of a substrate having upper and lower surfaces, the FET providing a current flow path between the upper and lower surfaces, and the FET having a plurality of drain regions extending to the substrate upper surface and an insulated gate electrode disposed on the upper surface, in that the drain regions are disposed in a hexagonal lattice pattern, and the gate electrode comprises: a plurality of gate segments each covering a respective drain region; and a plurality of connecting segments each connecting together three of the gate segments.

In the above-described power FET, the hexagonal lattice pattern is formed of a plurality of regular hexagons, each hexagon having six straight sides, and each drain region has a center which coincides substantially with the midpoint of a respective straight side of a hexagon.

DESCRIPTION OF THE PREFERRED EMBODIMENTS

Figure 2:
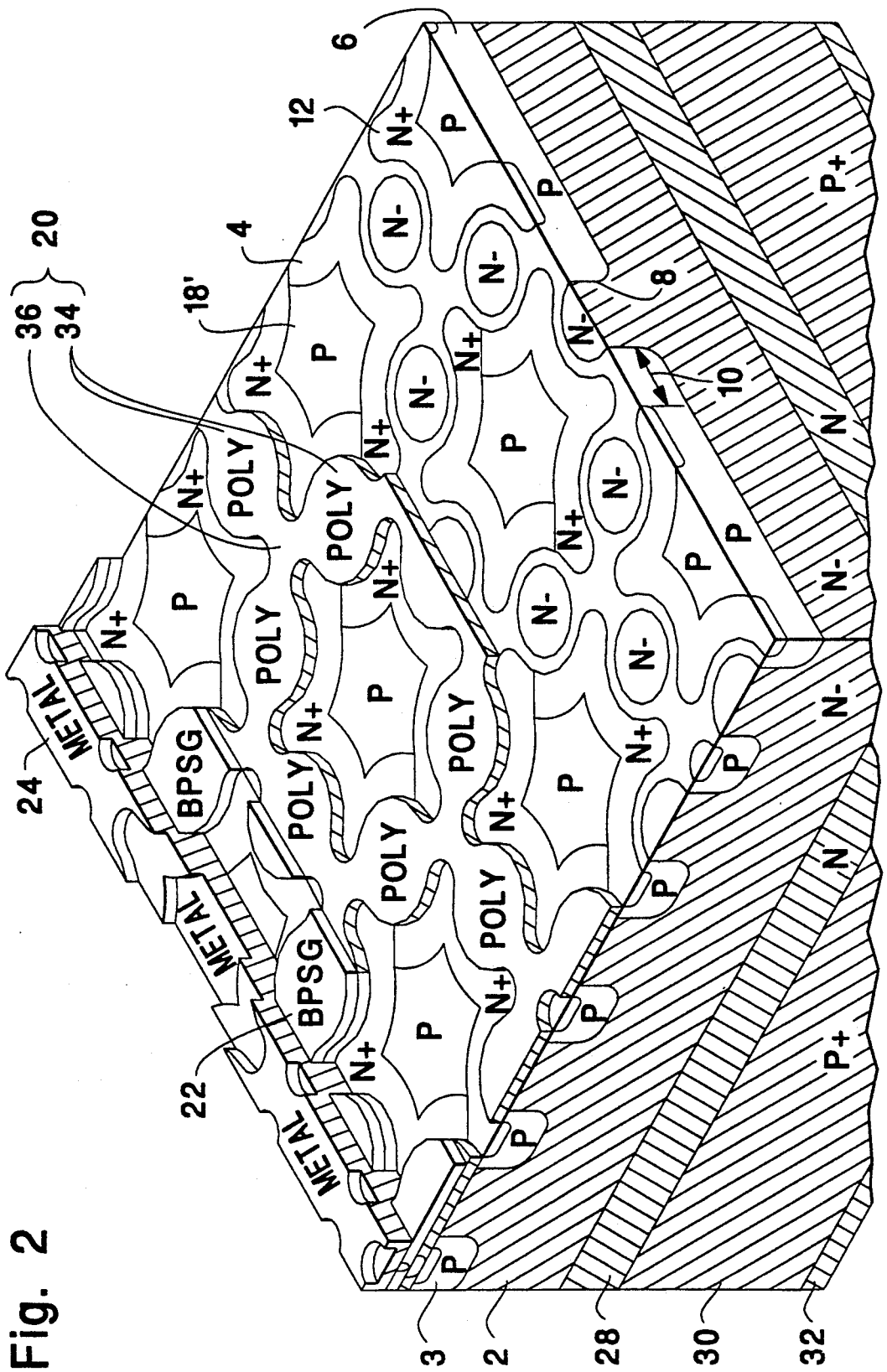
FIG. 2 is a perspective view of a transistor having a gate electrode structure constructed according to a preferred embodiment of the invention.

FIG. 2 illustrates one embodiment of an insulated gate device having a gate structure according to the present invention. The type of device to which the invention is particularly to be applied is a power FET which is employed to produce a controlled current flow in a vertical direction between source and drain electrodes disposed at the top and bottom, respectively, of a semiconductor chip.

The MOSFET is constituted by a semiconductor substrate and the illustrated embodiment is an N channel device. It will be appreciated that the invention may be applied to P channel devices.

In the illustrated structure, the substrate has an N⁻ body region 2 in which is formed, at the surface 4 of the substrate, at least one P conductivity base region 6. Wherever base region 6 is not present, body 2 extends to surface 4. A PN junction 8 is created between body 2 and base region 6 and the part of base region 6 adjacent both surface 4 and junction 8 constitutes the channel region 10 where switching of the MOSFET is controlled.

Devices of the type here under consideration have a structure such that a single base region 6 is produced in the form of a matrix or lattice, so that isolated parts of body 2 extend to surface 4. Hereinafter, for the sake of simplicity, region 6 will be referred to in the singular.

With the aid of suitable masking, N+ emitter, or source, regions 12 are formed in base region 6 to define the ends of channel regions 10 which are remote from junction 8. Regions 12 extend along the entire horizontal periphery of junction 8. Parts of base region 6 which are surrounded by a continuous source region 12 and which have a hexagonal form may be doped to have P+ conductivity adjacent surface 4. These parts constitute source contact areas 18'.

Surface 4 is covered with an insulating layer, e.g. of SiO$_2$, (not separately shown), a polycrystalline silicon gate 20 and a Boron Phosphorous Silicon Glass (BPSG) layer 22. Gate 20 and BPSG layer 22 are disposed above the locations where body 2 extends to surface 4. In addition, gate 20 and layer 22 extend across channels 10 and terminate on regions 12 so that a source metal layer 24 deposited on layer 22 and the exposed portions of surface 4 will contact regions 12 and the P+ conductivity areas 18' of base region 6.

In the device shown in FIG. 2, the substrate further includes an N layer 28 and a P+ layer 30 connected to drain electrode layer 32, so that the device constitutes an IGBT.

According to the invention, base region 6 and source regions 12 are patterned so that, at surface 4, base region 6 is composed of a plurality of annular portions linked together by connecting portions, and base region, 6 provides a plurality of channel regions 10 each surrounding a respective part of body 2 which extends to surface 4. Corresponding gate 20 and the underlying gate insulating layer are composed of gate segments 34 arranged in a hexagonal lattice pattern and connected together by connecting segments 36. Gate segments 34 are disposed to each coincide with a respective side of a regular hexagon, so that connecting segments 36 coincide with the corners of the hexagons and have a Y-shape. In other words, the center of each gate segment 34 coincides substantially with the midpoint of a side of a regular hexagon. Each gate segment 34 extends over an isolated part of body 2 which extends to surface 4 and over the channel region surrounding that isolated body part, and extends partially over an adjacent part of source region 12. Each connecting segment 36 is similarly located above a respective connecting portion of base region 6.

Therefore, each connecting segment 36 connects together three gate segments 34 and is shaped to establish a low resistance between gate segments. Specifically, when only a small distance exists between gate segments 34 and each connecting segment 36 connects together three adjacent gate segments, connecting segments can be dimensioned to provide low resistance links between gate segments.

Figure 1:
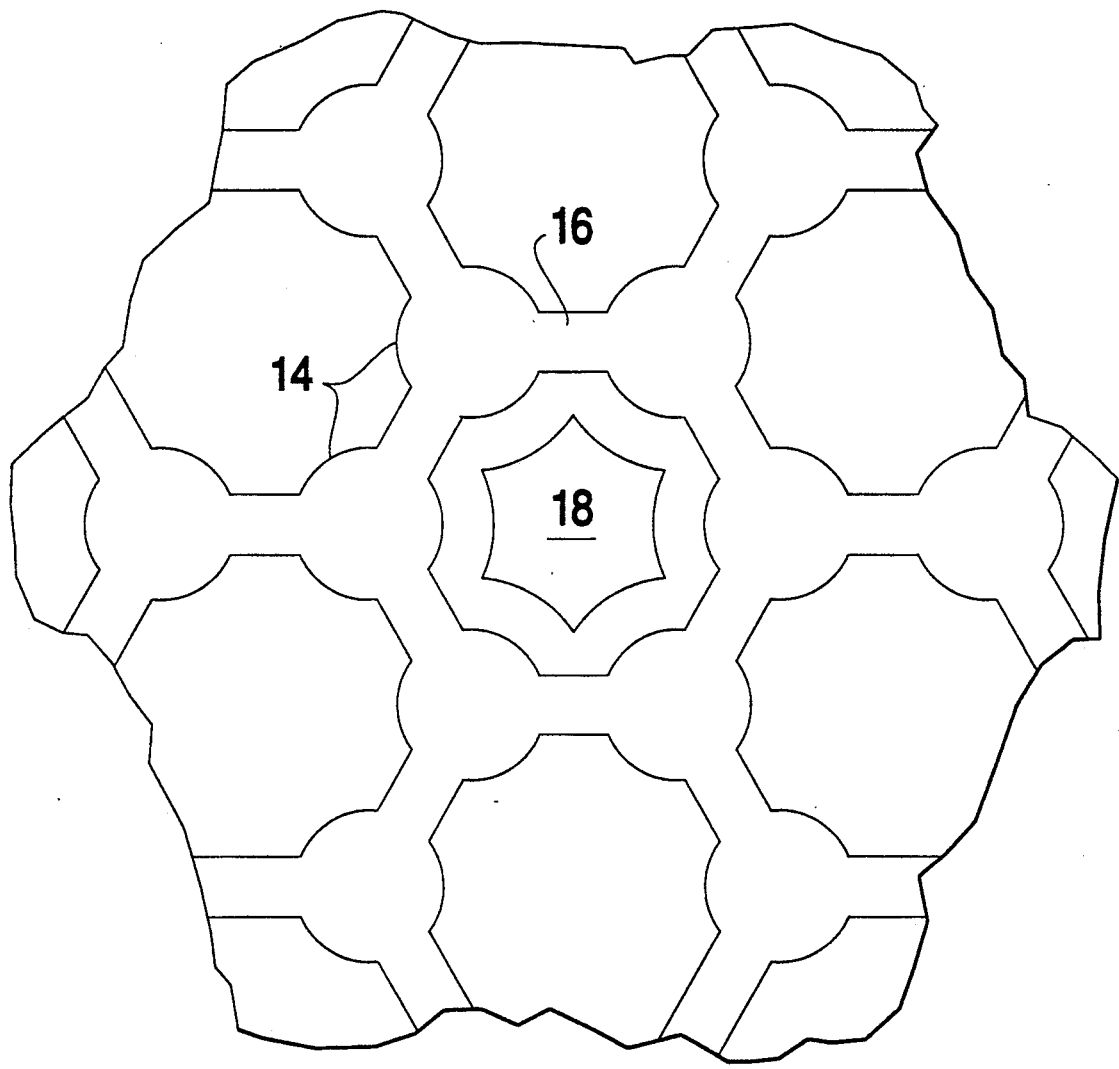
FIG. 1 is a plan view showing the arrangement of a gate electrode fabricated according to principles known in the art.

More specifically, if a transistor having the gate pattern shown in FIG. 1 and a transistor having the gate pattern shown in FIG. 2 were both constructed according to the same set of design rules, i.e. gate segments 14 and 34 have the same diameter, connecting segments 16 and 36 have the same width, source contact areas 18 and 18' have the same size and the two transistors have the same total surface area, it is found that the gate electrode structure according to the present invention, illustrated in FIG. 2, will provide the transistor with a lower on-resistance and a greater current-carrying capability. These advantages are a direct result of the fact that a gate structure according to the present invention will have more gate segments 34 per unit area and a greater channel width per gate segment.

A consideration of FIG. 1 will reveal that each gate segment 14 is shared by three contact areas 18. This means that one third of each gate segment 14 can be considered to be shared by each contact area 18, or each contact area 18 is associated with a total of two gate segments. On the other hand, with the structure shown in FIG. 2, each gate segment 34 is shared by only two contact areas 18', which means that each contact area 18' is associated with a total of three gate segments. Furthermore, as noted above, in the embodiment of FIG. 1 each gate segment 14 is connected to three connecting segments 16, while in the embodiment of the invention shown in FIG. 2, each gate segment 34 is connected to only two connecting segments 36.

The gate segments 14, 34 are the portions of the gate structure which control the device and which determine the on-resistance and the current-carrying capability of the device. The on-resistance of a MOSFET, for example, is roughly constituted by three components: channel resistance, neck resistance and blocking-layer resistance. The blocking-layer resistance is the resistance of the voltage blocking region of the device and is essentially fixed by established voltage-blocking requirements. Therefore, any effort to reduce the on-resistance of such a device must focus on the channel resistance and the neck resistance.

The channel, which is the region indicated at 10 in FIG. 2, is the actual region which controls current flow and which allows current to increase or decrease in response to changes in the gate signal. The channel can be visualized as a three-dimensional region having a length, width and thickness. Both the thickness and the conductivity of a channel are fixed by the nature of the semiconductor material, including its doping. The length of the channel is in the direction of carrier flow, while channel width is the dimension perpendicular to the length. In the embodiment shown in FIG. 2, channel length and width are both parallel to substrate surface 4. Channel resistance can be reduced by reducing channel length and/or by increasing channel width.

Various physical considerations place a lower limit on channel length, so that, as a practical matter, a reduction in channel resistance requires an increase in channel width.

According to the present invention, the channels are located roughly along the peripheries, or perimeters, of gate segments 34, so that the channel width of an individual gate segment is approximately equal to the circumference of the gate segment minus the areas where the gate segment connects to its associated connecting segments.

Each source contact area is generally equal to the area of a gate segment. This means that in the prior art structure of FIG. 1, where each source contact area is associated effectively with two gate segments, two thirds of the total surface area of the device is occupied by gate segments. In the structure according to the present invention, where there are effectively three gate segments associated with each source contact area, three fourths of the total transistor surface area is occupied by gate segments. Thus, in the structure according to the present invention there is an increase of 12.5% in the number of gate segments per unit area.

In addition, in the structure according to the invention, there are only two connecting segments 36 connected to each gate segment 34. Assuming typical dimensions for the gate structure, which could be of the order of a gate segment diameter of 20 microns and a connecting segment width of 4 microns, the result is an 8% increase in channel width in embodiments according to the present invention. Combined with the 12.5% increase in gate segments per unit area, the result is approximately a 20% increase in channel width per unit area, and a corresponding reduction in channel resistance, for embodiments of the present invention.

The neck resistance is the resistance of the neck area, which is that portion of drain region, or body, 2 which extends to the upper surface 4 of the substrate shown in FIG. 2. The neck area conducts current between the channel region and the voltage-blocking region. In order to minimize neck resistance, for a given neck resistivity and neck length, the neck area should be as large as possible. In an embodiment as shown in FIG. 2, the neck areas are located at the centers of the gate segments 34. In the structure according to the present invention, with an increase of 12.5% in the number of gate segments per unit area, there is a corresponding increase of 12.5% in the neck area, resulting in a corresponding reduction in neck resistance.

While in the illustrated embodiment, gate segments 34 and the isolated parts of body 2 are circular, other geometric shapes, including square, rectangular, elliptical, etc, may be employed in accordance with principles already known in the art.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a power FET composed of a substrate having upper and lower surfaces, the FET providing a current flow path between the upper and lower surfaces, and the FET having a plurality of drain regions extending to the substrate upper surface and an insulated gate electrode disposed on the upper surface, the improvement wherein said drain regions are isolated from one another at said substrate upper surface and are disposed on a hexagonal lattice pattern formed of a plurality of regular hexagons, with each hexagon having six straight sides and each drain region being positioned on a respective straight side, and said gate electrode comprises: a plurality of gate segments disposed in a hexagonal lattice pattern which coincides with the hexagonal lattice pattern in which said drain regions are disposed, each gate segment covering a respective drain region; and a plurality of connecting segments each connecting together three of said gate segments.

2. A power FET as defined in claim 1 wherein each said drain region has a center which coincides substantially with the midpoint of a respective straight side of a hexagon.

3. A power FET as defined in claim 2 wherein said gate segments and said connecting segments lie in a common plane.

4. A power FET as defined in claim 3 wherein each said connecting segment has the form of a Y.

5. A power FET as defined in claim 4 wherein each said gate segment has a circular shape.

6. A power FET as defined in claim 2 wherein each said connecting segment has the form of a Y.

7. A power FET as defined in claim 6 wherein each said gate segment has a circular shape.

8. A power FET as defined in claim 1 wherein said gate segments and said connecting segments lie in a common plane.

9. A power FET as defined in claim 8 wherein each said connecting segment has the form of a Y.

10. A power FET as defined in claim 9 wherein each said gate segment has a circular shape.

11. A power FET as defined in claim 1 wherein each said connecting segment has the form of a Y.

12. A power FET as defined in claim 11 wherein each said gate segment has a circular shape.

* * * * *